United States Patent [19]

Tajima

[11] Patent Number: 5,726,794
[45] Date of Patent: Mar. 10, 1998

[54] DC BIAS CONTROLLER FOR OPTICAL MODULATOR

[75] Inventor: Tsutomu Tajima, Tokyo, Japan

[73] Assignee: NEC Corporation, Tokyo, Japan

[21] Appl. No.: 579,203

[22] Filed: Dec. 27, 1995

[30] Foreign Application Priority Data

Dec. 28, 1994 [JP] Japan .................................. 6-327347

[51] Int. Cl.$^6$ .............................. H01S 3/00; H04L 25/06; G02F 1/03
[52] U.S. Cl. .......................... 359/249; 359/177; 359/183; 330/97
[58] Field of Search ........................... 359/177, 183, 359/187, 249; 327/307; 330/97

[56] References Cited

U.S. PATENT DOCUMENTS

| | | | |
|---|---|---|---|
| 5,175,749 | 12/1992 | Ficht et al. | 375/26 |
| 5,389,839 | 2/1995 | Heck | 327/307 |
| 5,570,227 | 10/1996 | Nabeyama et al. | 359/341 |

FOREIGN PATENT DOCUMENTS

| | | |
|---|---|---|
| 1085411 | 3/1989 | Japan . |
| 3181240 | 8/1991 | Japan . |
| 6308439 | 11/1994 | Japan . |

OTHER PUBLICATIONS

Kataoka et al, Trans. Inst. Electron. Inf. Commun. Eng. B–I (Japan), vol. J76B–I, #4 pp. 364–371, Apr. 1993; Abst Only Herewith.

*Primary Examiner*—Nelson Moskowitz
*Attorney, Agent, or Firm*—Whitham, Curtis, Whitham & McGinn

[57] ABSTRACT

A DC bias controller for an optical modulator includes an optical modulator, a demultiplexer, and a controller. The optical modulator intensity-modulates input DC light by a digital main signal superposed with a DC voltage to convert the DC light to an optical signal. The demultiplexer demultiplexes the optical signal from the optical modulator into output signal light and monitor signal light. The controller detects a change in modulation characteristics of the optical modulator on the basis of the monitor signal light from the demultiplexer to control a value of the DC voltage superposed on the digital main signal.

20 Claims, 3 Drawing Sheets

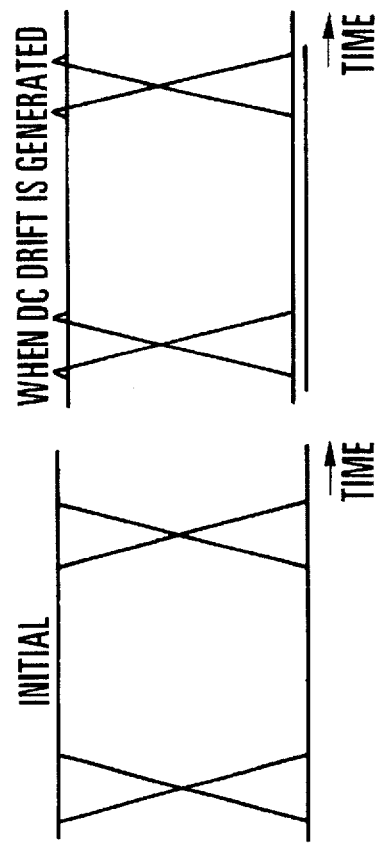
FIG. 2A
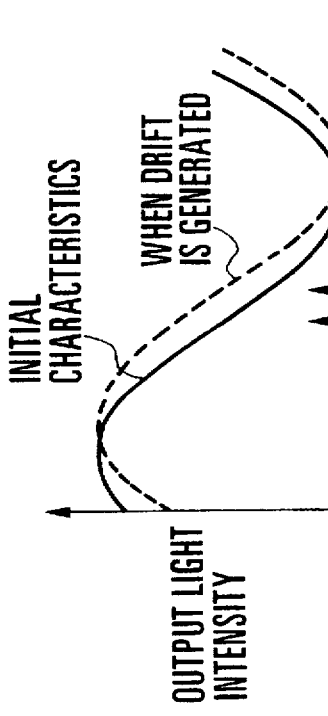
FIG. 2B
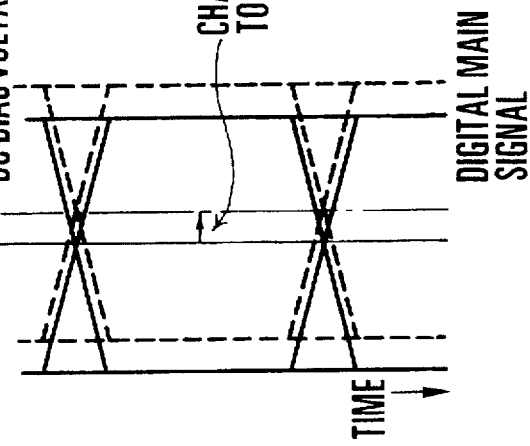
FIG. 3A
FIG. 3B ns with time is generated at the operating point of the LN modulator 1. Therefore, the operating point of the LN modulator 1 shifts from the optimum bias point to cause a degradation in optical signal waveform, resulting in a degradation in transmission characteristics, which may cause a coding error. FIGS. 3A and 3B show conventional optical output waveforms in the fixed bias state. At the initial time when no DC drift is generated, the optical signal waveform does not degrade, as shown in FIG. 3A. However, in the presence of a DC drift, the optical signal waveform degrades, as shown in FIG. 3B.

DC BIAS CONTROLLER FOR OPTICAL MODULATOR

BACKGROUND OF THE INVENTION

The present invention relates to a DC bias controller for an optical modulator and, more particularly, to a DC bias controller having a function of suppressing a DC offset or DC drift of an LiNbO$_3$ optical modulator (to be referred to as an LN modulator hereinafter).

In an optical communication system, generally, an intensity-modulated optical signal is sent from a transmission side to a transmission line by an optical transmitter, propagates through the transmission line, and reaches an optical receiver, thereby transmitting information. To perform light intensity modulation, a direct modulation technique for directly driving a light-emitting element such as a laser diode (to be referred to as an LD hereinafter), or an external modulation technique for intensity-modulating DC light by using an optical modulator and converting the DC light to an optical signal can be used.

Particularly in the direct modulation technique for directly driving an LD, the emitted optical spectrum spreads upon modulation, and the transfer rate or distance is limited by the wavelength dispersion characteristics of the optical fiber. On the other hand, in the external modulation technique using an optical modulator, DC light is intensity-modulated by the optical modulator and converted to an optical signal. Therefore, this technique is used in practice with a transfer rate of 10 Gb/s or more and a transfer distance of several thousands km or more.

Of various optical modulators, a Mach-Zehnder LN modulator can be particularly advantageously used because of its high response speed. FIG. 4 shows a circuit for converting DC light to an optical signal by using this LN modulator. Referring to FIG. 4, reference numeral 1 denotes an LN modulator; 2, a demultiplexer; 3, a PIN photodiode; 8, a negative feedback circuit; 10, an LD (laser diode); 11, a digital main signal input terminal; 12, an optical output terminal; 13, a resistor; and 19, an adder. Reference symbols L1 to L4 denote optical fiber cables.

In this circuit, DC light a emitted from the LD 10 is input to the LN modulator 1 through the optical fiber cable L1. A digital main signal S is input from the terminal 11, added to a direct current (DC) voltage V$_B$ from the negative feedback circuit 8 by the adder 19, and supplied to the LN modulator 1. In the LN modulator 1, the DC light a from the LD 10 is intensity-modulated by the digital main signal S superposed with the DC voltage V$_B$ and is converted to an optical signal b.

The optical signal b output from the LN modulator 1 reaches the demultiplexer 2 through the optical fiber cable L2 and is divided into transmission line output signal light c to the optical fiber cable L3 and monitor signal light d to the optical fiber cable L4. The transmission line output signal light c is sent from the output terminal 12 to the transmission line. The monitor signal light d from the optical fiber cable L4 is converted to an electrical signal (small current signal) by the photodiode 3. With this operation, a monitor voltage Vm according to the monitor signal light d is generated at the contact between the photodiode 3 and the resistor 13. The negative feedback circuit 8 changes the DC voltage V$_B$ superposed on the digital main signal S such that the difference between the monitor voltage Vm and a reference voltage V$_{ref}$ is compressed.

According to the conventional DC bias controller for the LN modulator, however, a DC drift or DC offset which

SUMMARY OF THE INVENTION

It is an object of the present invention to provide a DC bias controller for an optical modulator, which can prevent a degradation in transmission characteristics due to a DC offset or DC drift of the optical modulator, thereby performing stable optical transmission.

In order to achieve the above object, according to the present invention, there is provided a DC bias controller for an optical modulator, comprising an optical modulator for intensity-modulating input DC light by a digital main signal superposed with a DC voltage to convert the DC light to an optical signal, demultiplexer means for demultiplexing the optical signal from the optical modulator into output signal light and monitor signal light, and control means for detecting a change in modulation characteristics of the optical modulator on the basis of the monitor signal light from the demultiplexer means to control a value of the DC voltage superposed on the digital main signal, wherein the optical modulator operates at an optimum bias point in accordance with the DC voltage from the control means.

BRIEF DESCRIPTION OF THE DRAWINGS.

FIG. 2A is a graph showing the intensity modulation characteristics of the LN modulator;

FIG. 2B is a chart showing the waveform of a digital main signal S input to the LN modulator;

FIGS. 3A and 3B are charts showing conventional optical signal waveforms obtained in a fixed bias state in the absence of a DC drift and in the presence of a DC drift, respectively.

DESCRIPTION OF THE PREFERRED EMBODIMENT

Figure 1:
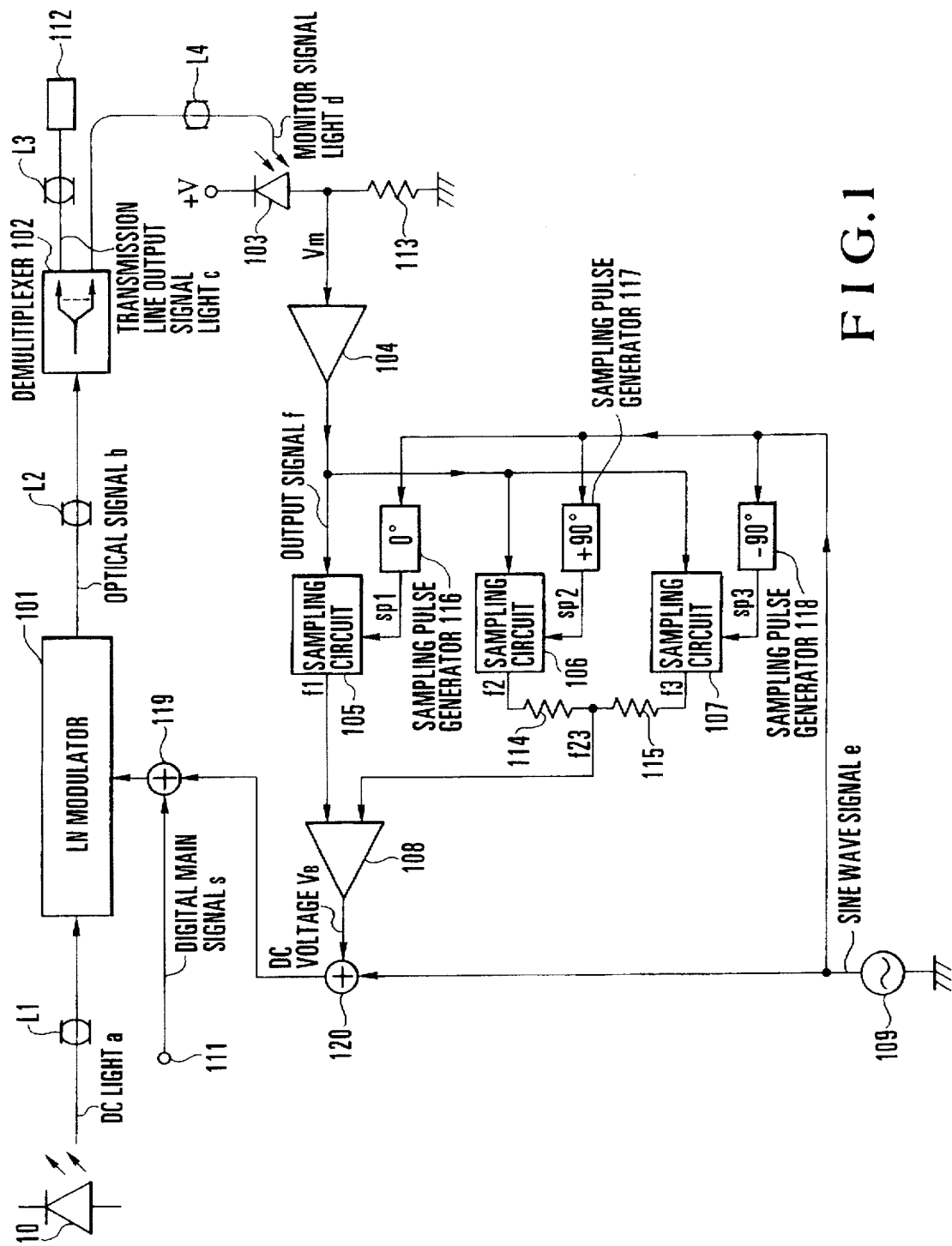
FIG. 1 is a block diagram showing a DC bias controller for an LN modulator according to an embodiment of the present invention.

An embodiment of the present invention will be described below in detail. FIG. 1 shows a DC bias controller for an LN modulator according to an embodiment of the present invention. Referring to FIG. 1, reference numeral 101 denotes an LN modulator using LiNbO$_3$ as a ferroelectric crystal; 102, a demultiplexer for branching an optical output from the LN modulator 101; 103, a PIN photodiode for converting an optical output from the demultiplexer 102 to an electrical signal; 104, an amplifier for amplifying the electrical signal converted by the PIN photodiode 103; 105 to 107, first to third sampling circuits for sampling an output from the amplifier 104 and outputting output signals f1 to f3, respectively; 108, a negative feedback circuit consisting of a differential amplifier for generating a negative feedback signal on the basis of the output signals f1 to f3 from the first to third sampling circuits 105 to 107; 109, a low-frequency oscillator for oscillating and outputting a low-frequency sine wave signal e with a small amplitude; 110, an LD (laser diode); 111, a digital main signal input terminal; 112, an optical output terminal; and 113 to 115, resistors.

Reference numeral 116 denotes a first sampling pulse generator for receiving the sine wave signal e from the low-frequency oscillator 109 and outputting a first sampling pulse SP1 in phase with the sine wave signal e; 117, a second sampling pulse generator for receiving the sine wave signal e output from the low-frequency oscillator 109 and outputting a second sampling pulse SP2 phase-advanced by 90° with respect to the sine wave signal e; 118, a third sampling pulse generator for receiving the sine wave signal e output from the low-frequency oscillator 109 and outputting a third sampling pulse SP3 phase-delayed by 90° with respect to the sine wave signal e; and 119 and 120, adders. Reference symbols L1 to L4 denote optical fiber cables.

The operation of the DC bias controller for the LN modulator with the above arrangement will be described below. DC light a emitted from the LD 110 is input to the LN modulator 101 through the optical fiber cable L1. A digital main signal S is input from the terminal 111, added to a DC voltage $V_B$ from the negative feedback circuit 108, which is superposed with the sine wave signal e, and supplied to the LN modulator 101. In the LN modulator 101, the DC light from the LD 110 is intensity-modulated by the digital main signal S superposed with the "sine wave signal e+DC voltage $V_B$" and is converted to an optical signal b.

The optical signal b output from the LN modulator 101 reaches the demultiplexer 102 and is divided into transmission line output signal light c to the optical fiber cable L3 and monitor signal light d to the optical fiber cable L4. The transmission line output signal light c is sent from the optical output terminal 112 to the transmission line. The monitor signal light d is converted to an electrical signal (small current signal) by the photodiode 103. With this operation, a monitor voltage Vm according to the monitor signal light d is generated at the contact between the PIN photodiode 103 and the resistor 113. The monitor voltage Vm is amplified by the amplifier 104 and output as an output signal f. The output signal f is supplied to the sampling circuits 105 to 107.

The sampling circuit 105 uses the sampling pulse SP1 from the sampling pulse generator 116 as a trigger signal to hold the output signal f from the amplifier 104 by sampling, and outputs the output signal f1. The sampling circuit 106 uses the sampling pulse SP2 from the sampling pulse generator 117 as a trigger signal to hold the output signal f from the amplifier 104 by sampling, and outputs the output signal f2. The sampling circuit 107 uses the sampling pulse SP3 from the sampling pulse generator 118 as a trigger signal to hold the output signal f from the amplifier 104 by sampling, and outputs the output signal f3.

The output signal f2 from the sampling circuit 106 and the output signal f3 from the sampling circuit 107 are applied across a series-connected circuit consisting of the resistors 114 and 115. An average value $f_{23}$ of the output signal f2 and the output signal f3 is output from the contact between the resistors 114 and 115. This average value $f_{23}$ is input to the negative feedback circuit 108 as a reference voltage. The negative feedback circuit 108 controls the DC voltage $V_B$ overlapping the digital main signal S such that the difference between the average value $f_{23}$ and the output signal f1 from the sampling circuit 105 is compressed.

In the above-described DC bias controller, when the DC bias voltage is normally applied with respect to the modulation characteristics of the LN modulator 101, the average value $f_{23}$ and the output signal f1 are equalized with each other, so the DC voltage $V_B$ does not change. When the DC bias voltage shifts from the optimum bias point, the average value $f_{23}$ differs from the output signal f1. For this reason, the DC voltage $V_B$ changes up to the optimum bias point. With this arrangement, the DC offset or DC drift of the LN modulator 101 is suppressed, and the LN modulator 101 can always operate at the optimum bias point.

Figure 4:
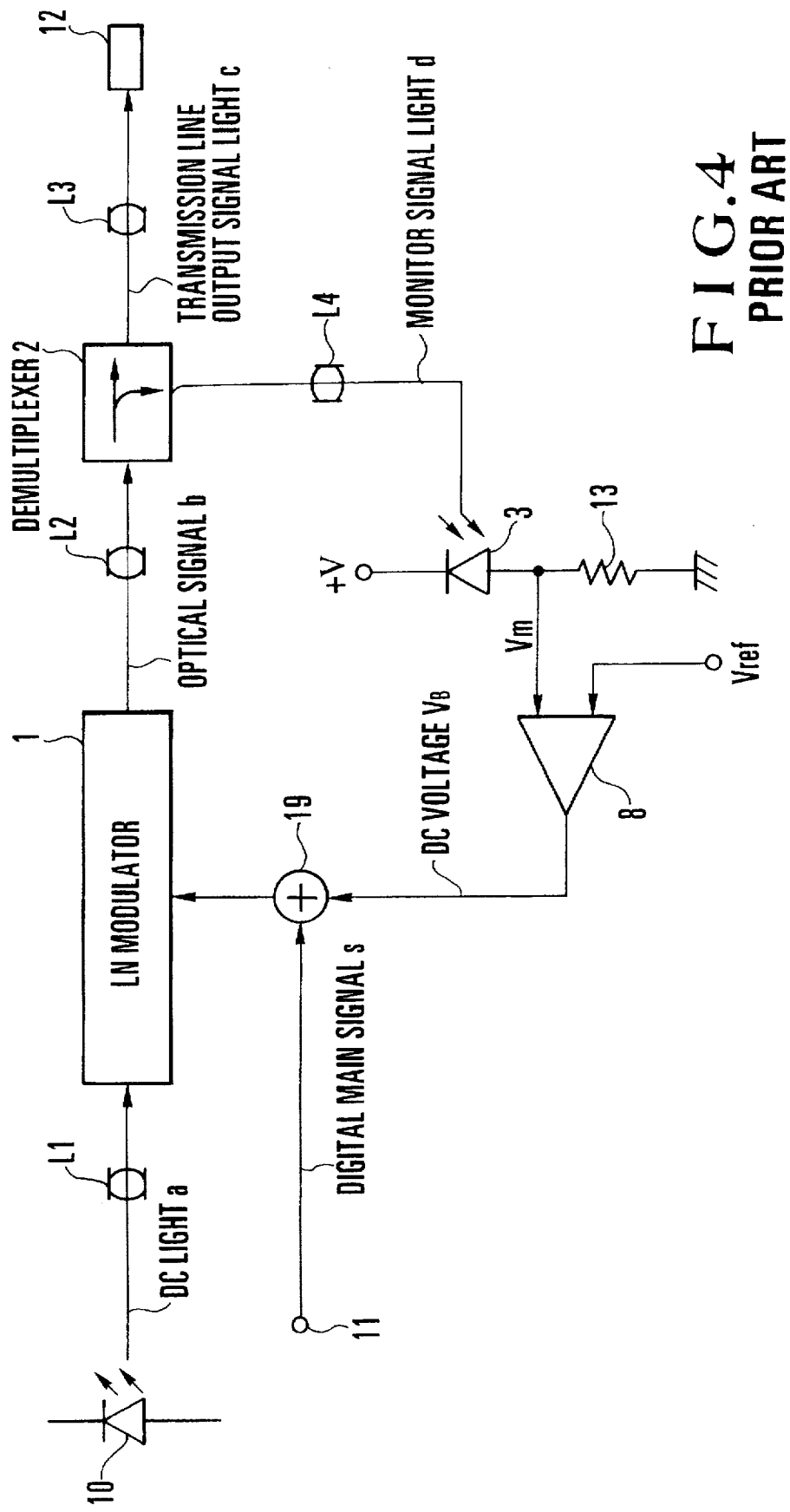
FIG. 4 is a block diagram showing a conventional DC bias controller for an LN modulator.

An optical signal waveform obtained when a DC drift is generated will be described below with reference to FIGS. 2A and 2B. FIG. 2A shows the intensity modulation characteristics of the LN modulator 101, in which the initial characteristics in the absence of a DC drift are indicated by a solid line, and those observed in the presence of a DC drift are indicated by a dotted line. FIG. 2B shows the waveform of the digital main signal S input to the LN modulator 101. When a DC bias voltage x is applied with respect to the initial modulation characteristics, and the LN modulator 101 is driven by the digital main signal S, an optical signal waveform free from degradation, which has the same waveform as in FIG. 3A, is obtained as the optical signal b. At this time, when the DC bias voltage x is fixed as shown in FIG. 4, and a drift is generated in intensity modulation characteristics as indicated by the dotted line in FIG. 2A, the waveform of the optical signal b degrades, as shown in FIG. 3B. When the DC bias voltage x is automatically changed to a point y, the optical signal b obtains the same waveform as in the absence of a DC drift, as shown in FIG. 3A.

In this embodiment, a change in intensity modulation characteristics of the LN modulator 101 is detected as the difference between the average value $f_{23}$ and the output signal f1. The LN modulator 101 always operates at the optimum bias point by controlling the DC voltage $V_B$ to compress this difference.

As is apparent from the above description, according to the present invention, a change (a DC offset or DC drift) in modulation characteristics of the LN modulator is detected, and the DC voltage superposed on the digital main signal is controlled such that the LN modulator always operates at the optimum bias point. By preventing a degradation in optical signal output waveform due to the DC offset or DC drift of the LN modulator, optical communication can be stably performed while preventing a degradation in transmission characteristics.

What is claimed is:

1. A Direct Current (DC) controller for an optical modulator, comprising:

an optical modulator for intensity-modulating input DC light by a digital main signal superposed with a DC voltage to convert the DC light to an optical signal;

demultiplexer means for demultiplexing the optical signal from said optical modulator into output signal light and monitor signal light; and control means for detecting a change in modulation characteristics of said optical modulator on the basis of the monitor signal light from said demultiplexer means to control a value of the DC voltage superposed on the digital main signal, wherein said optical modulator operates at an optimum bias point in accordance with the DC voltage from said control means, said control means comprising a plurality of sampling circuits for sampling and holding a voltage signal corresponding to an output of said demultiplexer means using respectively, as a trigger signal, sampling pulses each having a predetermined phase relationship with a sine wave signal input thereto, wherein the DC voltage to be superposed on the digital main signal comprises a voltage such that a difference between an average value of the voltage signals from predetermined ones of said sampling circuits and the voltage signal from another predetermined sampling circuit different from said predetermined ones, is minimized.

2. A Direct Current (DC) controller for an optical modulator, comprising:

an optical modulator for intensity-modulating input DC light by a digital main signal superposed with a DC voltage to convert the DC light to an optical signal;

demultiplexer means for demultiplexing the optical signal from said optical modulator into output signal light and monitor signal light; and control means for detecting a change in modulation characteristics of said optical modulator on the basis of the monitor signal light from said demultiplexer means to control a value of the DC voltage superposed on the digital main signal, wherein said optical modulator operates at an optimum bias point in accordance with the DC voltage from said control means, said DC bias controller further comprising oscillation means for oscillating a low-frequency sine wave signal with a small amplitude, and superposing means for superposing the sine wave signal from said oscillation means on the DC voltage supplied to said optical modulator.

3. A controller according to claim 2, wherein said control means comprises:

photoelectric conversion means for converting the monitor signal light from said demultiplexer means to a voltage signal;

first sampling means for sampling and holding the voltage signal from said photoelectric conversion means using, as a trigger signal, a first sampling pulse in phase with the sine wave signal from said oscillation means;

second sampling means for sampling and holding the voltage signal from said photoelectric conversion means using, as a trigger signal, a second sampling pulse phase-advanced by 90° with respect to the sine wave signal from said oscillation means;

third sampling means for sampling and holding the voltage signal from said photoelectric conversion means using, as a trigger signal, a third sampling pulse phase-delayed by 90° with respect to the sine wave signal from said oscillation means; and DC voltage generation means for generating the DC voltage to be superposed on the digital main signal such that a difference between an average value of the voltage signals from said second and third sampling means and the voltage signal from said first sampling means is compressed.

4. A controller according to claim 3, further comprising a series-connected resistor circuit comprising two resistors series-connected to each other and, upon application of the voltage signals from said second and third sampling means to two terminals of said series-connected resistor circuit, outputs a voltage signal representing the average value of the applied voltage signals from a resistor contact to said DC voltage generation means.

5. A controller according to claim 4, wherein said DC voltage generation means comprises a differential amplifier for differentially amplifying the voltage signal from said series-connected resistor circuit and the voltage signal from said first sampling means and outputting the DC voltage.

6. A controller according to claim 1, further comprising superposing means for superposing the DC voltage from said control means on the digital main signal, and for outputting the DC voltage to said optical modulator.

7. A controller according to claim 1, wherein said optical modulator comprises an $LiNbO_3$ optical modulator using $LiNbO_3$ as a ferroelectric crystal.

8. A Direct Current (DC) bias controller for an $LiNbO_3$ optical modulator, comprising:

an $LiNbO_3$ optical modulator for intensity-modulating input DC light by a digital main signal superposed with a DC voltage and converting the DC light to an optical signal;

demultiplexer means for demultiplexing the optical signal from said optical modulator into output signal light and monitor signal light;

conversion means for converting the signal light from said demultiplexer means to a small current signal and thereafter extracting the small current signal as a voltage signal;

amplification means for amplifying the voltage signal from said conversion means;

oscillation means for oscillating a low-frequency sine wave signal with a small amplitude;

first sampling means for sampling and holding the voltage signal from said amplification means using, as a trigger signal, a first sampling pulse in phase with the sine wave signal from said oscillation means;

second sampling means for sampling and holding the voltage signal from said amplification means using, as a trigger signal, a second sampling pulse phase-advanced by 90° with respect to the sine wave signal from said oscillation means;

third sampling means for sampling and homing the voltage signal from said amplification means using, as a trigger signal, a third sampling pulse phase-delayed by 90° with respect to the sine wave signal from said oscillation means;

DC voltage generation means for generating the DC voltage superposed on the digital main signal on the basis of a difference between an average value of voltage signals from said second and third sampling means and a voltage signal from said first sampling means; and superposing means for superposing the sine wave signal from said oscillation means on the DC voltage from said DC voltage generation means and supplying the DC voltage to said optical modulator.

9. A controller according to claim 1, further comprising oscillation means for oscillating the sine wave signal, said sine wave signal comprising a low-frequency sine wave signal with a predetermined amplitude.

10. A controller according to claim 1, further comprising superposing means for superposing the sine wave signal on the DC voltage supplied to said optical modulator.

11. A controller according to claim 1, wherein said control means comprises:

a photoelectric converter for converting the monitor signal light from said demultiplexer means to a voltage signal, and wherein said plurality of sampling circuits includes a first sampling circuit for sampling and holding the voltage signal from said photoelectric converter using, as a trigger signal, a first sampling pulse in phase with the sine wave signal.

12. A controller according to claim 11, wherein said plurality of sampling circuits further comprises:

a second sampling circuit for sampling and holding the voltage signal from said photoelectric converter using, as a trigger signal, a second sampling pulse phase-advanced by 90° with respect to the sine wave signal.

13. A controller according to claim 12, wherein said plurality of sampling circuits further comprises:

a third sampling circuit for sampling and holding the voltage signal from said photoelectric converter using, as a trigger signal, a third sampling pulse phase-delayed by 90° with respect to the sine wave signal.

14. A controller according to claim 13, wherein said control means further comprises:

a DC voltage generator for generating the DC voltage to be superposed on the digital main signal such that a difference between an average value of the voltage signals from said second and third sampling circuits and the voltage signal from said first sampling circuit is minimized.

15. A controller according to claim 14, further comprising:

a series-connected resistor circuit comprising first and second resistors series-connected to each other and, upon application of the voltage signals from said second and third sampling circuits to two terminals of said series-connected resistor circuit, outputs a voltage signal representing the average value of the applied voltage signals from a resistor contact to said DC voltage generator.

16. A controller according to claim 15, wherein said DC voltage generator comprises a differential amplifier for differentially amplifying the voltage signal from said series-connected resistor circuit and the voltage signal from said first sampling circuit and outputting the DC voltage.

17. A controller according to claim 14, wherein said DC voltage generator comprises a differential amplifier.

18. A controller according to claim 1, wherein said control means comprises:

a photoelectric converter for converting the monitor signal light from said demultiplexer means to a voltage signal, at least some of said sampling pulses having a different phase than that of said sine wave signal; and a DC voltage generator for generating the DC voltage to be superposed on the digital main signal.

19. A controller according to claim 18, wherein said another predetermined sampling circuit comprises a first sampling circuit and said predetermined ones of said sampling circuits comprises first and second sampling circuits, said controller further comprising a series-connected resistor circuit comprising first and second resistors series-connected to each other and, upon application of the voltage signals from said second and third sampling circuits to two terminals of said series-connected resistor circuit, outputs a voltage signal representing the average value of the applied voltage signals from a resistor contact to said DC voltage generator.

20. A controller according to claim 1, wherein at least some of said sampling pulses having a different phase than that of said sine wave signal.

* * * * *